US012782878B2

(12) United States Patent
Hakobyan et al.

(10) Patent No.: US 12,782,878 B2
(45) Date of Patent: Nov. 3, 2026

(54) EXTERNAL PART COMPONENT OF A WATCH COMPRISING A PHOTOVOLTAIC CELL AND WATCH INCLUDING SAID EXTERNAL PART COMPONENT

(71) Applicant: The Swatch Group Research and Development Ltd, Marin (CH)

(72) Inventors: Sargis Hakobyan, Boudry (CH); Alain Jornod, Neuchâtel (CH); François Gueissaz, Cormondrèche (CH)

(73) Assignee: The Swatch Group Research and Development Ltd, Marin (CH)

( * ) Notice: Subject to any disclaimer, the term of this patent is extended or adjusted under 35 U.S.C. 154(b) by 956 days.

(21) Appl. No.: 18/100,237

(22) Filed: Jan. 23, 2023

(65) Prior Publication Data

US 2023/0375982 A1 Nov. 23, 2023

(30) Foreign Application Priority Data

May 18, 2022 (EP) ..................................... 22174146

(51) Int. Cl.
*G04C 10/02* (2006.01)
*H10F 77/20* (2025.01)

(52) U.S. Cl.
CPC ........... *G04C 10/02* (2013.01); *H10F 77/215* (2025.01)

(58) Field of Classification Search
CPC ....... G04C 10/02; G04C 10/00; H10F 77/215; G04G 17/02; G04G 17/06; G04G 19/00
See application file for complete search history.

(56) References Cited

U.S. PATENT DOCUMENTS 6,229,766 B1 * 5/2001 Saurer .................... G04C 10/02 368/232
9,823,625 B2 * 11/2017 Abe ....................... G04R 60/12
2012/0120776 A1 * 5/2012 Fleury .................... G04B 19/30 368/205
2016/0109861 A1 * 4/2016 Kim ........................ G04G 9/00 368/69
2020/0028004 A1 1/2020 Nagano
2021/0132547 A1 * 5/2021 Schenk .................. G04C 10/02

FOREIGN PATENT DOCUMENTS

CN 1328660 A * 12/2001 .......... G04G 9/0082
DE 697 35 159 T2 10/2006
JP 2006-275525 A 10/2006
WO 97/27520 A1 7/1997

OTHER PUBLICATIONS

Translation of CN-1328660-A (Year: 2001).*
European Search Report for Application No. 22 17 4146 dated Oct. 8, 2022.

* cited by examiner

*Primary Examiner* — Edwin A. Leon
(74) *Attorney, Agent, or Firm* — Sughrue Mion, PLLC

(57) ABSTRACT

An external part component (10) of a watch including a photovoltaic cell (20) including an elementary solar cell (21) interposed between two electrodes, one of which is an upper electrode (22) arranged over a face of the elementary solar cell (21) intended to be subjected to an incident light radiation, the upper electrode (22) being formed by sections (220) arranged according to a predetermined pattern matching with a graphical representation of a constellation, the photovoltaic cell (20) being intended to be electrically connected to an electronic horological movement (30).

4 Claims, 1 Drawing Sheet

EXTERNAL PART COMPONENT OF A WATCH COMPRISING A PHOTOVOLTAIC CELL AND WATCH INCLUDING SAID EXTERNAL PART COMPONENT

CROSS REFERENCE TO RELATED APPLICATION

This application claims priority to European Patent Application No. 22174146.5 filed May 18, 2022, the entire contents of which are incorporated herein by reference.

TECHNICAL FIELD OF THE INVENTION

The invention relates to the field of external part components of timepieces.

More particularly, the invention relates to an external part component of a watch comprising a photovoltaic cell and a watch including said external part component.

Technological Background

Beyond a determined surface area, typically a few tens of square centimetres or a few square centimetres, the photovoltaic cells made of a semiconductor material include an upper electrode in the form of an array of metal lines shaped as a grid and a lower electrode arranged on either side of an elementary solar cell.

The upper electrode is arranged over the face of the photovoltaic cell subjected to an incident light radiation and is intended to collect the charge carrier generated by the elementary solar cell. The arrangement of the upper electrode at the surface of the solar cell results from a trade-off between the shadowing degree of the face of the solar cell over which it is deposited and the optical absorption of the elementary solar cell.

In the case of a photovoltaic cell intended to be arranged over a dial of a watch, for aesthetical reasons, the upper electrode is generally disposed so as to be concealed from a user so that only the elementary solar cell is visible. This considerably reduces the efficiency of the photovoltaic cell, particularly at high illumination because of the electrical resistance induced by the hidden electrode, less optimum than a visible electrode.

In order to overcome this drawback, watches have been designed so as to have a dial apertured by a set of holes invisible to the naked eye or a translucent dial, superimposed with a photovoltaic cell, this type of approaches allowing hiding the electrode arranged over the cell.

Thus, the photovoltaic cell is not or barely visible for a user, but these solutions are not satisfactory to the extent that the dial blocks a portion of the light radiation likely to reach said photovoltaic cell, which negatively affects its efficiency.

SUMMARY OF THE INVENTION

The invention solves the aforementioned drawbacks and, to this end, relates to an external part component of a watch comprising a photovoltaic cell including an elementary solar cell interposed between two electrodes, one of which so-called "upper electrode" is arranged over a face of the elementary solar cell intended to be subjected to an incident light radiation and intended to be visible to a user.

The upper electrode is formed by segments connected together and arranged according to a predetermined pattern, for example matching with a graphical representation of a constellation, the photovoltaic cell being intended to be electrically connected to an electronic horological movement. Advantageously, the external part component comprises a dial provided with an aperture opposite which the photovoltaic cell is configured to be arranged. The external part component further includes a movable display interposed between the dial and the photovoltaic cell and being intended to be driven in motion by the horological movement so that at least one portion of its travel is visible through the aperture.

The upper electrode includes a peripheral portion arranged at the periphery of the face of the elementary solar cell intended to receive an incident light radiation. The peripheral portion defines an area within which the segments extend, said segments being connected to the peripheral portion.

Advantageously, the upper electrode can thus generate a decoration while enabling the photovoltaic cell to have an improved yield without affecting the aesthetics of the piece.

Thanks to the features of the invention, the photovoltaic cell can be integrated for example in a lunar phase module, and in particular, the elementary solar cell can form the background of the lunar phase.

In particular embodiments, the invention may further include one or more of the following features, taken alone or according to any technically possible combinations.

This feature contributes to increasing the yield of the photovoltaic cell by improving the collection of the charge carriers and lowering the resistance of the upper electrode.

According to another aspect, the present invention relates to a watch including an electronic horological movement and an external part component as described before, wherein the photovoltaic cell is fastened without any degree of freedom on a carrier structure formed by a bridge or a plate of the horological movement.

In particular embodiments, the watch includes the external part component, and the photovoltaic cell materialises a lunar phase background and represents a sky vault, the movable display including at least one representation of a moon.

Thanks to the segments of the upper electrode, the present invention allows generating a graphical representation of a constellation in order to generate a decoration while increasing the yield of the photovoltaic cell.

BRIEF DESCRIPTION OF THE FIGURES

Other features and advantages of the invention will become apparent upon reading the following detailed description given by way of non-limiting example, with reference to the appended drawings wherein.

DETAILED DESCRIPTION OF THE INVENTION

Figure 1:
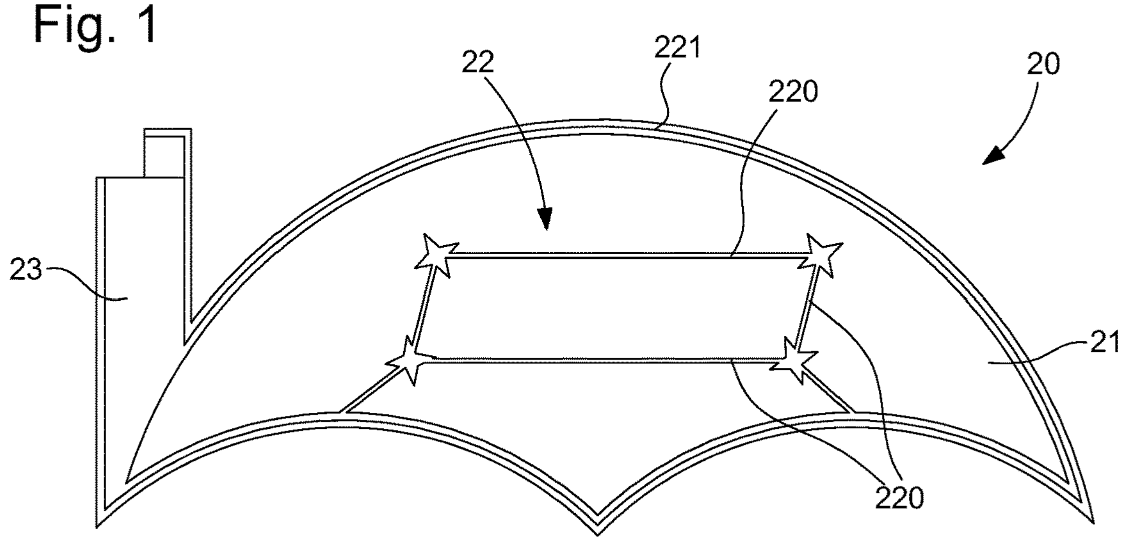
FIG. 1 schematically represents a front view of a photovoltaic cell of an external part component according to a preferred embodiment of the invention.

FIG. 1 shows an external part component 10 of a watch according to an embodiment of the invention. The external part component 10 comprise a photovoltaic cell 20 including an elementary solar cell 21 interposed between two electrodes. The photovoltaic cell 20 is intended to be electrically connected to an electronic horological movement 30 of the watch.

The horological movement 30 of the watch includes an electricity storage member, such as a battery, intended to supply with energy, via an electronic circuit 32, at least one electric motor allowing driving an hour display and a minute display in rotation through geartrains.

An electrode called "upper electrode" 22 is intended to be visible by a user and is arranged over a face of the elementary solar cell 21 intended to be subjected to an incident light radiation. A lower electrode, for example in the form of a thin metal layer, (not represented in the figures) is arranged opposite to the upper electrode 22 over the elementary solar cell 21.

The upper electrode 22 is formed by segments 220 connected together, made of an electrically-conductive material, for example a metal material, such as gold or silver. These segments 220 are arranged according to a predetermined pattern of a graphical representation of at least one constellation, as shown in FIGS. 1 and 2.

Thus, the external part component 10 includes representations of stars, a star representation being arranged at the junction between two segments 220. The representations of stars may be made of the same material as that in which the segments 220 are made.

Figure 2:
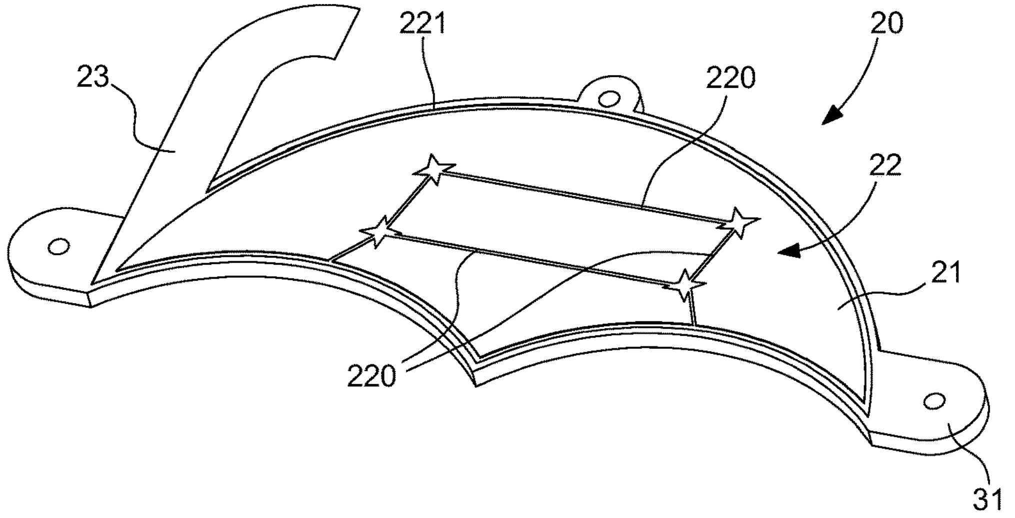
FIG. 2 schematically represents a perspective view of a portion of an external part component according to a preferred embodiment of the invention.

More particularly, as shown in FIGS. 1 and 2, the upper electrode 22 includes a peripheral portion 221 connected to the segments 220 and arranged at the periphery of the face of the elementary solar cell 21 intended to receive an incident light radiation. In other words, this peripheral portion 221 forms an area within which the segments 220 extend, from said peripheral portion 221.

The peripheral portion 221 is connected to a connecting tab 23 intended to be connected to the horological movement 30 so as to transmit the electricity collected by the elementary solar cell 21 to the electricity storage member. More specifically, the connecting tab 23 is intended to be connected to the electronic circuit 32 or example by an anisotropic conductive thermoadhesive film, through a loosely-fitted connector or through a flexible printed circuit portion fastened on the electronic circuit 32 for example by an anisotropic conductive adhesive.

Figure 3:
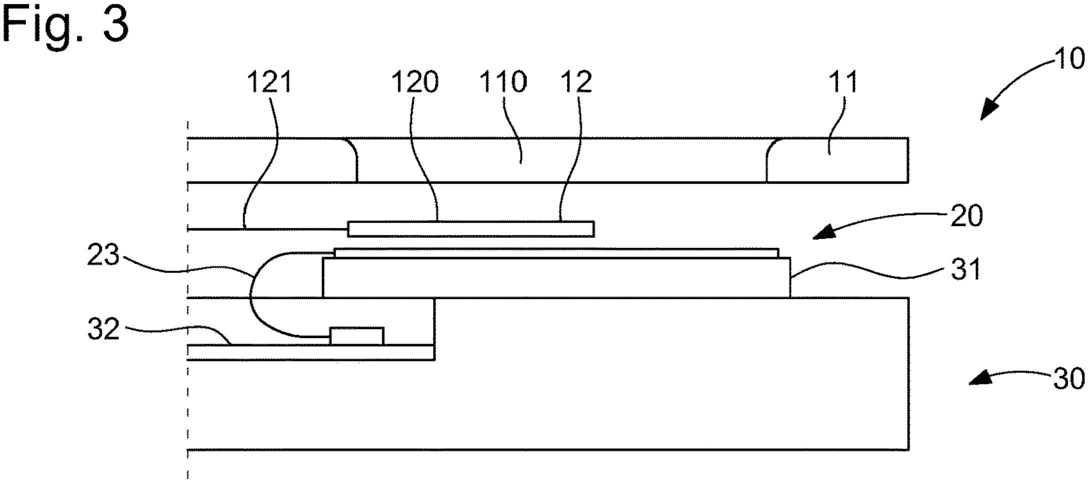
FIG. 3 represents a cross-sectional view of an external part component installed on a horological movement of a watch.

In a preferred embodiment of the invention, the external part component 10 includes a dial 11, as shown in FIG. 3, provided with an aperture 110 opposite which the photovoltaic cell 20 is configured to be arranged. Thus, a user can see the photovoltaic cell 20 through the aperture, and said photovoltaic cell 20 can be subjected to a light radiation.

In the embodiment represented in FIGS. 2 and 3, the photovoltaic cell 20 is intended to be rigidly fastened, i.e. fastened without any degree of freedom, for example by gluing, on a carrier structure 31. For example, such a carrier structure 31 may be formed by a bride, as represented in FIGS. 2 and 3, or by a plate of the horological movement 30.

Preferably, the external part component 10 further includes a movable display 12 interposed between the dial 11 and the photovoltaic cell 20. The movable display 12 is intended to be driven in motion by the horological movement 30 so that at least one portion of its travel is visible through the aperture 110.

In particular, the movable display 12 includes at least one representation of a moon and is intended to be moved opposite the aperture 110 so that its travel corresponds to a lunation. In the embodiment represented in FIG. 3, the movable display 12 includes at least one eccentric disc 120 representing a moon, fastened at the end of an arbor 121 intended to be driven in rotation by the horological movement 30 so that said eccentric disc 120 moves according to a circular path. Alternatively, the movable display 12 may include a disc made of a transparent material, on which at least one moon is eccentrically represented. The disc is arranged so as to be driven in rotation by the movement about an axis passing through its centre, so that the representation of the moon moves according to a circular path.

The moon may be represented by printing, such as pad printing, by etching or by any other suitable means known to a person skilled in the art.

The photovoltaic cell 20 materialises a lunar phase background and represents a sky vault whose background has the same colour as the elementary solar cell 21, and comprising at least one constellation represented by the upper electrode 22.

In the preferred embodiment of the invention, the elementary solar cell 21 comprises at least one layer made of a semiconductor material, for example of gallium arsenide or of silicon, over which an anti-reflection layer is superimposed.

Advantageously, the upper electrode 22 of the photovoltaic cell 20 may be made by photolithography over a substrate consisting of the elementary solar cell 21.

Tests have shown that a photovoltaic cell 20 according to the invention having a 0.3 $cm^2$ elementary solar cell 21 is capable of supplying enough electricity to the horological movement 30 to ensure operation thereof in a sustainable manner, under a 1 $W/m^2$ illumination and in a configuration of the upper electrode 22 as schematically represented in FIGS. 1 and 2.

More generally, it should be noted that the implementations and embodiments considered above have been described by way of non-limiting examples, and that other variants are consequently possible.

In particular, in another embodiment of the invention, the photovoltaic cell 20 may be arranged over the dial 11, so that the upper electrode 22 represents a constellation over the face of the dial 11 intended to be visible.

The invention claimed is:

1. An external part component of a watch comprising:

a photovoltaic cell including an elementary solar cell interposed between two electrodes, one of which is an upper electrode arranged over a face of the elementary solar cell configured to be subjected to an incident light radiation, said upper electrode being formed by segments connected together and arranged according to a predetermined pattern, said upper electrode including a peripheral portion arranged at the periphery of said face of the elementary solar cell, the segments extending within an area defined by said peripheral portion and being connected to the peripheral portion, the photovoltaic cell being configured to be electrically connected to an electronic horological movement;

a dial provided with an aperture opposite which the photovoltaic cell is configured to be arranged so that a user can see the photovoltaic cell through the aperture; and a movable display interposed between the dial and the photovoltaic cell and being configured to be driven in motion by the horological movement so that at least one portion of its travel is visible through the aperture.

2. The external part component according to claim 1, wherein the predetermined pattern matches with a graphical representation of a constellation.

3. A watch including the electronic horological movement and the external part component according to claim 1, wherein the photovoltaic cell is fastened without any degree of freedom on a carrier structure formed by a bridge or a plate of the horological movement.

4. The watch according to claim 3, wherein the photovoltaic cell materialises a lunar phase background and represents a sky vault, the movable display including at least one representation of a moon.

* * * * *